(12) United States Patent
Sakurai et al.

(10) Patent No.: US 8,049,509 B2
(45) Date of Patent: Nov. 1, 2011

(54) BATTERY INFORMATION ACQUIRING APPARATUS

(75) Inventors: Hiroki Sakurai, Tokyo (JP); Tetsuro Itakura, Tokyo (JP); Toshiyuki Umeda, Tokyo (JP); Akiko Yamada, Yokohama (JP); Nobuo Shibuya, Hiratsuka (JP); Yoshinao Tatebayashi, Yokohama (JP); Daisuke Kurose, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 464 days.

(21) Appl. No.: 12/406,451

(22) Filed: Mar. 18, 2009

(65) Prior Publication Data

US 2010/0073003 A1    Mar. 25, 2010

(30) Foreign Application Priority Data

Sep. 25, 2008 (JP) ................... 2008-246253

(51) Int. Cl.
*G01N 27/416* (2006.01)
(52) U.S. Cl. ........................................... 324/426
(58) Field of Classification Search .................. 324/426
See application file for complete search history.

(56) References Cited

U.S. PATENT DOCUMENTS

2008/0045792 A1* 2/2008 Shimizu et al. ............... 600/118
2008/0091364 A1* 4/2008 Lim et al. ........................ 702/63
2009/0052417 A1   2/2009 Sakamoto et al.
2009/0174410 A1* 7/2009 Kim et al. ..................... 324/426

FOREIGN PATENT DOCUMENTS

JP    2005-135762    5/2005

OTHER PUBLICATIONS

U.S. Appl. No. 12/364,061, filed Feb. 2, 2009, Takafumi Sakamoto, et al.

* cited by examiner

*Primary Examiner* — Edward Tso
*Assistant Examiner* — M'Baye Diao
(74) *Attorney, Agent, or Firm* — Oblon, Spivak, McClelland, Maier & Neustadt, L.L.P.

(57) ABSTRACT

A battery information acquiring apparatus includes a voltage acquiring unit which acquires an inter-terminal voltage of the battery cell; a battery information acquiring circuit which acquires battery information of the battery cell with the acquired voltage being supplied as a first power supply voltage and; a radio circuit which transmits a signal of the battery information to the management unit via the antenna with the acquired voltage being supplied as a second power supply voltage and; a rectification circuit which receives a radio signal from the management unit via the antenna, rectify the received radio signal and generate a DC voltage; and a control circuit which controls supply of the first and second power supply voltages to the battery information acquiring circuit and the radio circuit wherein the control circuit operates with the generated DC voltage being supplied as a third power supply voltage.

13 Claims, 12 Drawing Sheets

BATTERY INFORMATION ACQUIRING APPARATUS

CROSS REFERENCE TO RELATED APPLICATIONS

This application is based upon and claims the benefit of priority from the prior Japanese Patent Applications No. 2008-246253, filed on Sep. 25, 2008; the entire contents of which are incorporated herein by reference.

BACKGROUND OF THE INVENTION

1. Field of the Invention

The present invention relates to a battery information acquiring apparatus that acquires battery information of a battery cell in a battery pack made up of a plurality of battery cells connected in series or in parallel, and transmits the battery information to a management unit that manages the battery pack.

2. Related Art

As supply of battery power for electric cars or industrial vehicles, battery packs in which many battery cells of low voltage and low capacity are connected in series or in parallel are used to obtain a high voltage and high capacity voltage. Safe operation of a battery pack requires a battery information management system that monitors a voltage and temperature or the like of each battery cell.

For example, JP-A 2005-135762 (Kokai) proposes a state monitoring apparatus using radio waves as a scheme for realizing a battery information management system. This configuration supplies a power supply voltage for the state monitoring apparatus from a battery cell or radio tag and involves a problem that when a power supply voltage is supplied from the battery cell, power is also consumed during standby during which control signals and battery information are not communicated. Furthermore, since the radio tag has poor power conversion efficiency, power consumption on the supply side of power increases due to supply of power to all state monitoring apparatuses.

SUMMARY OF THE INVENTION

According to an aspect of the present invention, there is provided with a battery information acquiring apparatus that acquires battery information of a battery cell in a battery pack including a plurality of the battery cells connected in series or in parallel and transmits the battery information to a management unit that manages a state of the battery pack via an antenna, comprising:

a voltage acquiring unit configured to acquire an inter-terminal voltage of the battery cell;

a battery information acquiring circuit configured to acquire battery information of the battery cell, the battery information acquiring circuit being supplied with the inter-terminal voltage acquired by the voltage acquiring unit as a first power supply voltage;

a radio circuit configured to transmit a signal of the battery information to the management unit via the antenna, the radio circuit being supplied with the inter-terminal voltage acquired by the voltage acquiring unit as a second power supply voltage;

a rectification circuit configured to receive a radio signal from the management unit via the antenna and rectify the received radio signal to generate a DC voltage; and a control circuit configured to control supply of the first and second power supply voltages to the battery information acquiring circuit and the radio circuit, the control circuit being supplied with the DC voltage generated by the rectification circuit as a third power supply voltage, wherein the control circuit includes:

a first command receiver configured to receive a first command signal indicating whether or not to supply the first power supply voltage to the battery information acquiring circuit, from the management unit via the antenna;

a second command receiver configured to receive a second command signal indicating whether or not to supply the second power supply voltage to the radio circuit, from the management unit via the antenna;

a first controller configured to control supply of the first power supply voltage to the battery information acquiring circuit according to the first command signal; and a second controller configured to control supply of the second power supply voltage to the radio circuit according to the second command signal.

DETAILED DESCRIPTION OF THE INVENTION

With reference now to the attached drawings, embodiments of the present invention will be explained in detail below.

Figure 1:
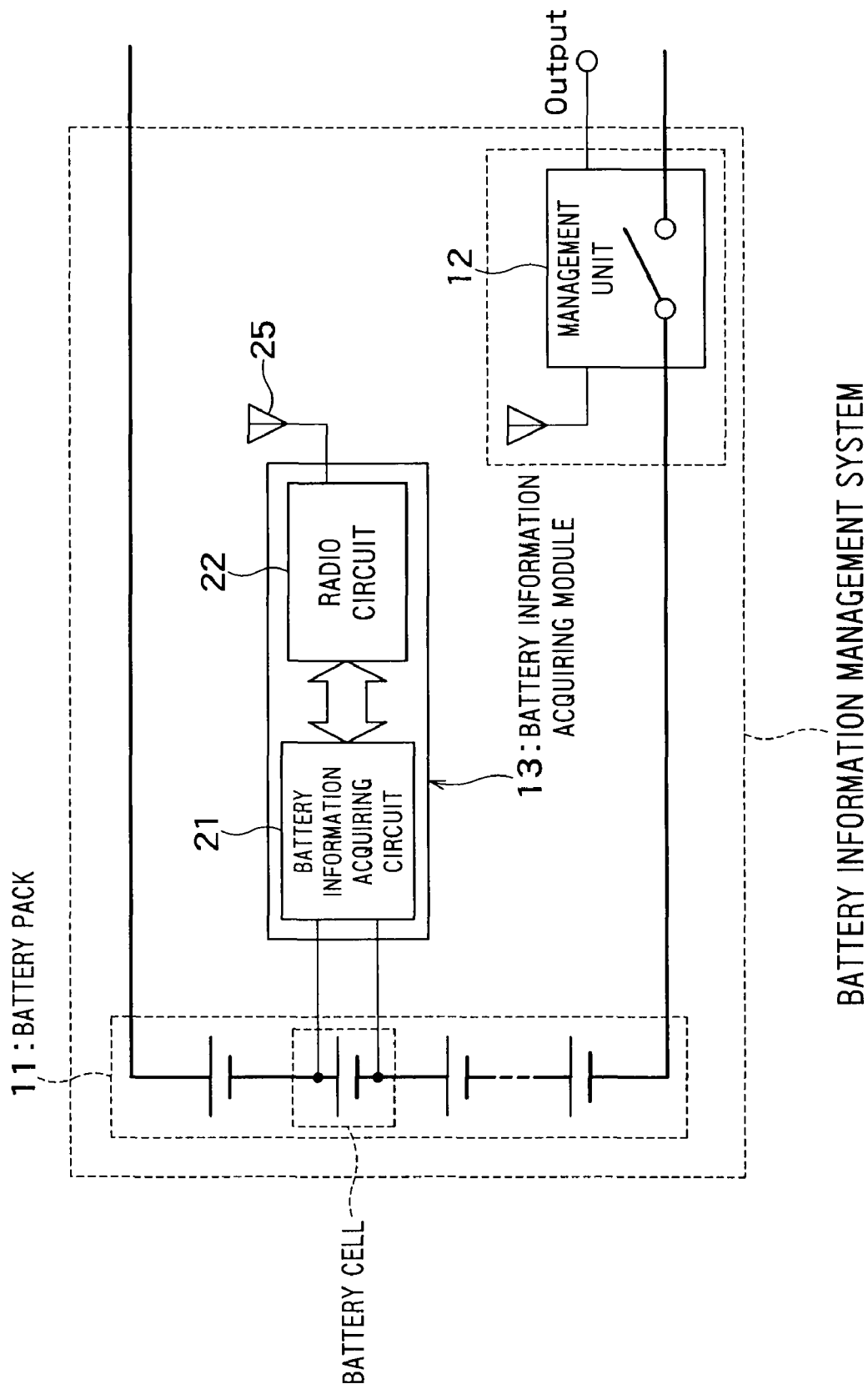
FIG. 1 schematically shows a configuration of a battery information management system according to an embodiment of the present invention.

FIG. 1 is a block diagram schematically showing a configuration of a battery information management system according to an embodiment of the present invention. This battery information management system can be incorporated in a system or apparatus such as vehicle system or power-assisted bicycle that operates using a battery pack.

Figure 5:
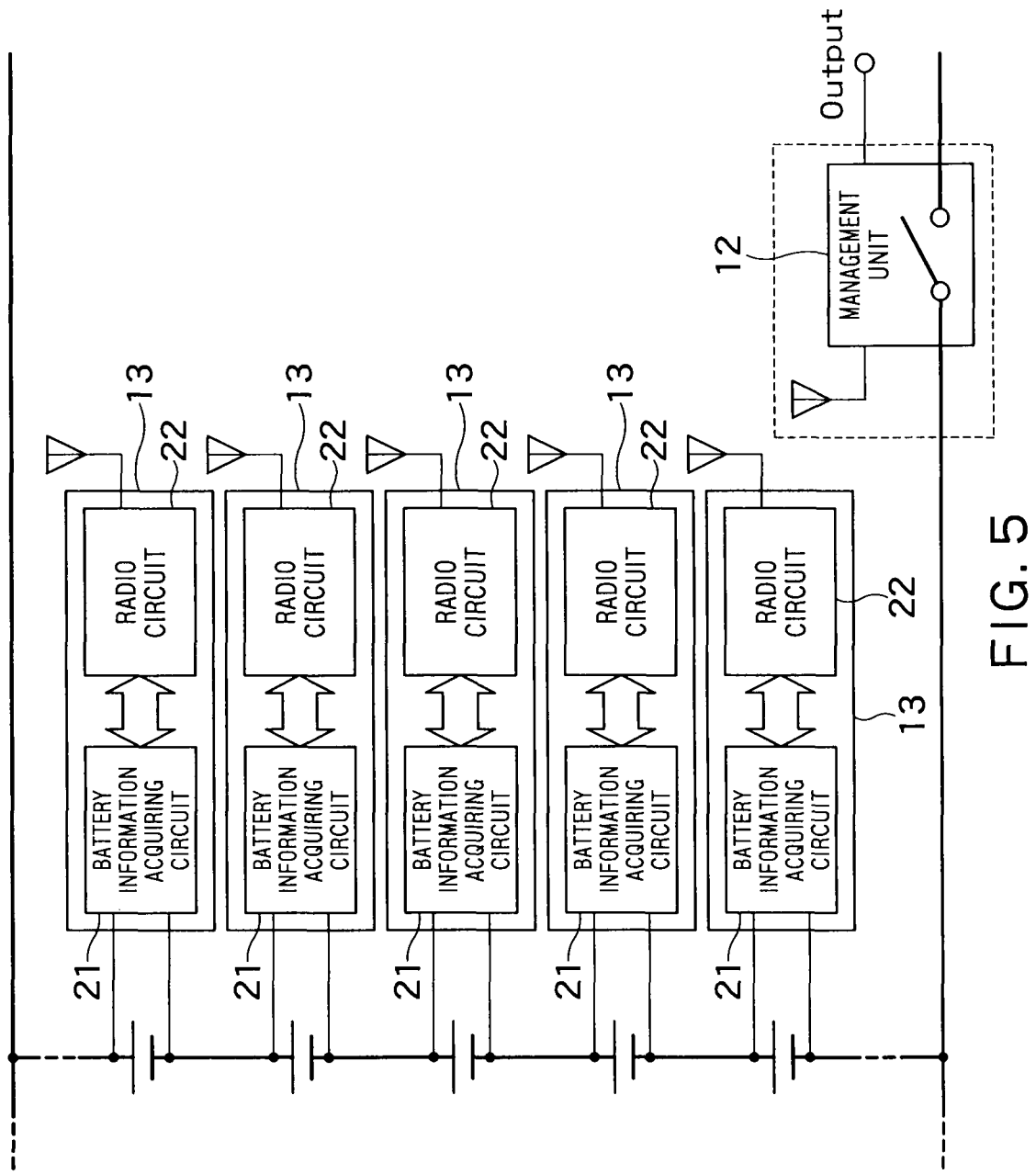
FIG. 5 shows a configuration example where one battery acquiring module is connected for each battery cell.

The battery information management system in FIG. 1 is provided with a battery pack 11 made up of a plurality of battery cells connected in series, a management unit 12 that manages the state of the battery pack and a battery information acquiring module (battery information acquiring apparatus) 13 that acquires battery information from the battery cell of the battery pack and transmits the battery information to the management unit. Here, one battery acquiring module is connected to one battery cell for simplicity of notation, but battery acquiring modules are actually connected likewise to other battery cells as shown in FIG. 5.

The battery pack 11 is made up of a plurality of battery cells connected in series. Connecting a plurality of battery cells in series in this way makes it possible to obtain a voltage higher than the voltage of one battery cell. To obtain a still greater battery capacity, a plurality of such battery packs 11 may be provided and connected in parallel. Here, the battery pack 11 is a plurality of battery cells connected in series, but the present invention is also applicable to a plurality of battery cells connected in parallel.

Figure 2:
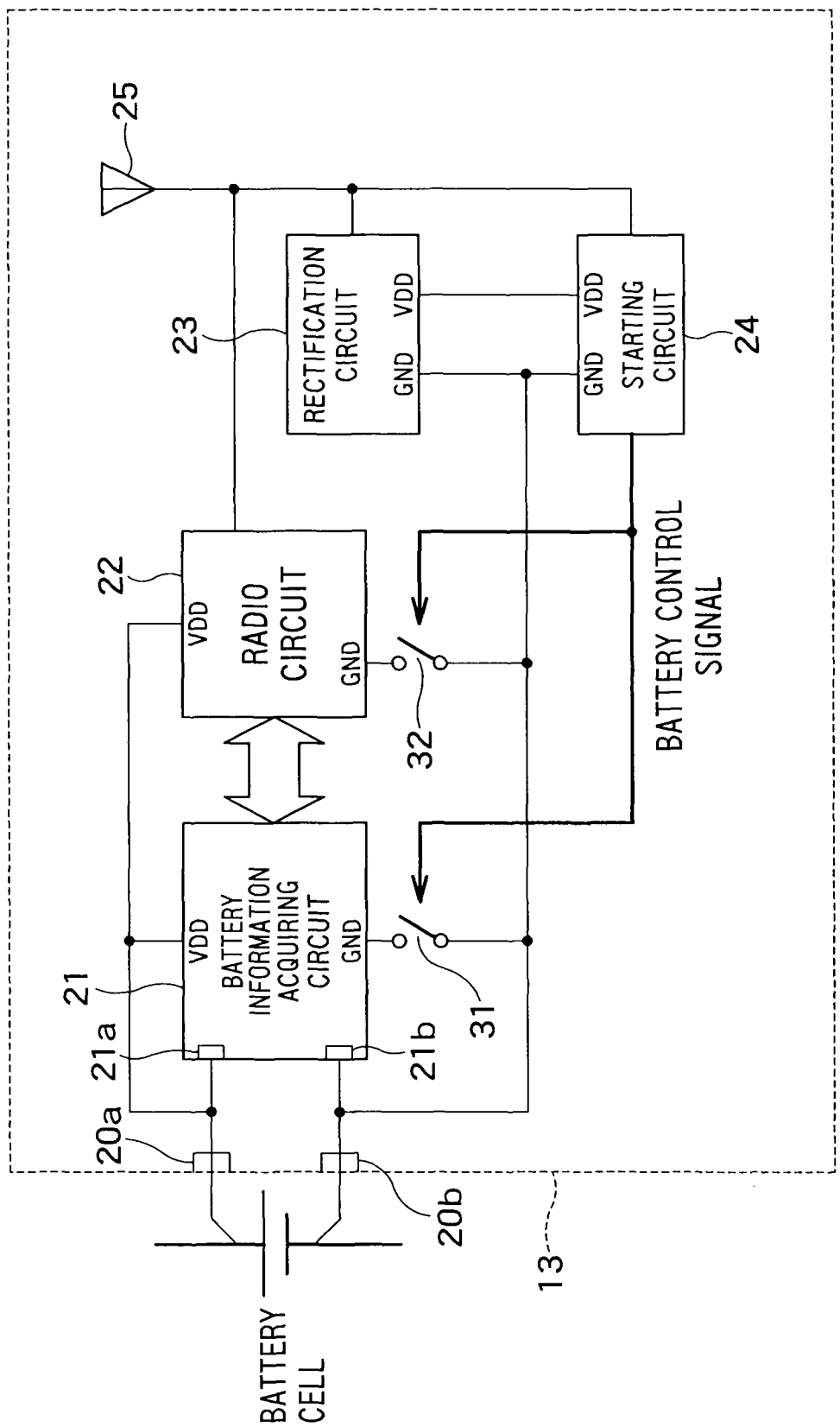
FIG. 2 shows a detailed configuration of a battery information acquiring module.

The battery information acquiring module 13 detects battery information such as an inter-terminal voltage (voltage between plus terminal and minus terminal) of each battery cell of the battery pack 11 or a temperature of each battery cell and transmits the detected battery information to the management unit 12 by radio. More specifically, a battery information acquiring circuit 21 acquires the battery information and a radio circuit 22 transmits the battery information to the management unit 12 via an antenna 25. FIG. 1 shows only the battery information acquiring circuit 21, radio circuit 22 and antenna 25 as elements of the battery information acquiring module 13, but in practice, other elements as shown in FIG. 2, which will be described later are also included. Carrying out communication of battery information by radio eliminates the necessity for wiring and parts for connecting the management unit 12 and the battery information acquiring module 13. Furthermore, by acquiring battery information of one battery cell using one battery information acquiring circuit 21, it is possible to reduce the voltage applied to the battery information acquiring circuit 21 and peripheral circuits (other circuits in the battery information acquiring module and external parts associated therewith (resistors and capacitors or the like)) and use low-voltage parts.

The management unit 12 acquires battery information from the battery information acquiring module 13 corresponding to each battery cell by radio and manages the battery pack based on the acquired battery information so that the battery pack operates safely. The management unit 12 has the function of outputting the acquired battery information to outside.

FIG. 2 shows a detailed configuration of the battery information acquiring module 13.

The battery information acquiring module 13 is provided with voltage acquiring units 20a and 20b, the battery information acquiring circuit 21, the radio circuit 22, a rectification circuit 23, a starting circuit 24 and the antenna 25.

The antenna 25 transmits/receives a high frequency radio signal to/from an antenna of the management unit 12.

The voltage acquiring units 20a and 20b are connected to a plus terminal and a minus terminal of the battery cell via connection wire respectively. In this way, the voltage acquiring units acquire the inter-terminal voltage of the battery cell. This voltage is used as a power supply voltage (operating voltage) of the battery information acquiring circuit 21 and radio circuit 22. Furthermore, this voltage is acquired by the battery information acquiring circuit 21 via input terminals 21a and 21b as battery information.

The battery information acquiring circuit 21 has a VDD terminal and a GND terminal, and the VDD terminal is connected to the plus terminal of the battery cell via the voltage acquiring unit 20a and the GND terminal is connected to the minus terminal of the battery cell via a switch unit 31 and voltage acquiring unit 20b. The battery information acquiring circuit 21 is given the voltage of the battery cell between the VDD terminal and GND terminal when the switch unit 31 is ON, and operates on this voltage which corresponds to a first power supply voltage of the present invention (power of the battery information acquiring circuit 21 turns ON). Furthermore, the battery information acquiring circuit 21 also has the input terminal (voltage input unit) 21a which is connected to the plus terminal of the battery cell via the voltage acquiring unit 20a and the input terminal (voltage input unit) 21b connected to the minus terminal of the battery cell via the voltage acquiring unit 20b, and the battery information acquiring circuit 21 acquires the voltage inputted between the input terminals 21a and 21b as battery information. Furthermore, the battery information acquiring circuit 21 acquires the temperature of the battery cell using a temperature sensor (see FIG. 6) which will be described later as battery information. The battery information is acquired when a transmission command from the management unit 12 is inputted via the radio circuit 22 and the battery information acquiring circuit 21 outputs the acquired battery information to the radio circuit 22. The switch unit 31 may also be connected between the plus terminal and the VDD terminal of the battery cell.

The radio circuit 22 has a VDD terminal and a GND terminal, and the VDD terminal is connected to the plus terminal of the battery cell via the voltage acquiring unit 20a and the GND terminal is connected to the minus terminal of the battery cell via a switch unit 32 and the voltage acquiring unit 20b. When the switch unit 32 is ON, the radio circuit 22 is given the voltage of the battery cell between the VDD terminal and GND terminal and operates on this voltage which corresponds to a second power supply voltage of the present invention (power of the radio circuit 22 turns ON). In an ON-state, the radio circuit 22 detects a transmission command signal transmitted through a high-frequency wave from the management unit 12 via the antenna 25 and outputs the detected transmission command to the battery information acquiring circuit 21. The radio circuit 22 acquires the battery information inputted from the battery information acquiring circuit 21 in response to the transmission command and modulates the signal of the acquired battery information into a high-frequency signal and transmits the signal to the management unit 12 via the antenna 25. Here, the radio circuit 22 is given a unique ID (identifier) and this allows the radio circuit 22 to be individually identified from radio circuits of battery information acquiring modules connected to other battery cells. When battery information is transmitted, the ID is also transmitted and this allows the management unit 12 to recognize the battery cell from which the received battery information derives. The management unit 12 monitors the state of each battery cell based on the acquired battery information and can output the state of each battery cell to outside. The switch unit 32 may also be connected between the plus terminal of the battery cell and the VDD terminal.

The rectification circuit 23 receives the high-frequency signal transmitted from the management unit 12 via the antenna 25, rectifies the received high-frequency signal and generates a DC voltage. The rectification circuit 23 has a GND terminal and a VDD terminal, and gives the DC voltage generated to the starting circuit 24 via these terminals.

The starting circuit (control circuit) 24 has a GND terminal and a VDD terminal and is given the DC voltage from the rectification circuit 23 via these terminals as a power supply voltage which corresponds to a third power supply voltage of the present invention. When given the DC voltage, the starting circuit 24 is activated. Upon receiving a starting signal through a high-frequency wave from the management unit 12 via the antenna 25, the activated starting circuit 24 gives power control signals for turning ON the switch units 31 and 32 to the respective switch units 31 and 32 and thereby turns ON the switch units 31 and 32. That is, the starting circuit 24 turns ON the power of the battery information acquiring circuit 21 and the radio circuit 22. Upon receiving an end signal through a high-frequency wave from the management unit 12 via the antenna 25, the starting circuit 24 gives power control signals for turning OFF the switch units 31 and 32 to the respective switch units 31 and 32 and thereby turns OFF the switch units 31 and 32. That is, the starting circuit 24 turns OFF the power of the battery information acquiring circuit 21 and the radio circuit 22.

An example has been shown here where the switch units 31 and 32 are turned ON and OFF simultaneously, but the switch units 31 and 32 may also be controlled so as to be turned ON and OFF separately. That is, when a first starting signal (first command signal) is received from the management unit 12, the switch unit 31 may be turned ON and when a second starting signal (second command signal) is received, the switch unit 32 may be turned ON, and when a first end signal (first command signal) is received, the switch unit 31 may be turned OFF and when a second end signal (second command signal) is received, the switch unit 32 may be turned OFF.

The starting circuit 24 includes a first command receiver that receives a first command signal, a second command receiver that receives a second command signal, a first controller that controls ON/OFF of the switch unit 31 (that is, whether or not to supply a power supply voltage to the battery information acquiring circuit) according to the contents of the first command signal and a second controller that control ON/OFF of the switch unit 32 (that is, whether or not to supply a power supply voltage to the radio circuit) according to the contents of the second command signal.

The high-frequency signal received via the antenna 25 may include a transmission command signal or a starting signal or may include neither of the signals, but the received high-frequency signal is inputted to all of the radio circuit 22, rectification circuit 23 and starting circuit 24. The radio circuit 22 detects the transmission command signal from the inputted high-frequency signal and the starting circuit 24 detects the starting signal from the inputted high-frequency signal. The rectification circuit 23 rectifies the received high-frequency signal and generates a DC voltage regardless of the type of the signal included.

An example of operations in the above-described configuration will be explained.

First, both the switches 31 and 32 are set to OFF and therefore the power of the battery information acquiring circuit 21 and radio circuit 22 is OFF. A procedure for acquiring and transmitting battery information in this state will be shown below.

First, a high-frequency signal of a predetermined frequency is transmitted from the management unit 12 and received by the antenna 25. The high-frequency signal received by the antenna 25 is inputted to the rectification circuit 23 and converted to a DC voltage. This DC voltage is inputted to the starting circuit 24 as a power supply voltage thereof. This allows the starting circuit 24 to operate.

Next, a starting signal included in the high-frequency signal is transmitted from the management unit 12 and received by the antenna 25. The starting circuit 24 detects this starting signal. The starting circuit 24 having detected the starting signal generates a power supply control signal for turning ON the switches 31 and 32 and transmits the power supply control signal to the switches 31 and 32. This causes the switches 31 and 32 to turn ON and causes the power of the battery information acquiring circuit 21 and radio circuit 22 to turn ON.

Next, a transmission command signal is included in the high-frequency signal and transmitted from the management unit 12 and received by the antenna 25. The radio circuit 22 detects this transmission command signal, converts this transmission command signal to an instruction (transmission command) for operating the battery information acquiring circuit 21 and transmits the instruction to the battery information acquiring circuit 21.

Upon receiving this transmission command, the battery information acquiring circuit 21 acquires the battery information and sends the acquired battery information to the radio circuit 22. The radio circuit 22 modulates the received battery information into a high-frequency signal and transmits the high-frequency signal to the management unit 12.

The management unit 12 having acquired the battery information includes an end signal in the high-frequency signal and transmits the high-frequency signal. This end signal is detected by the starting circuit 24 via the antenna 25. Upon detecting the end signal, the starting circuit 24 generates power control signals for turning OFF the switches 31 and 32 and transmits the power control signals to the switches 31 and 32. This causes the switches 31 and 32 to turn OFF and causes the power of the battery information acquiring circuit 21 and radio circuit 22 to turn OFF.

During the above-described operation, suppose the rectification circuit 23 is always receiving a high-frequency signal from the management unit 12 as input and performing rectification operation.

As described above, by rectifying a high-frequency signal received via the antenna 25, generating a DC voltage and driving the starting circuit (control circuit) that controls ON/OFF of power of the battery information acquiring circuit 21 and the radio circuit 22 using the DC voltage generated, it is possible to reduce power consumed by the battery cell during standby during which the battery information acquiring circuit 21 and radio circuit 22 do not operate.

Figure 3:
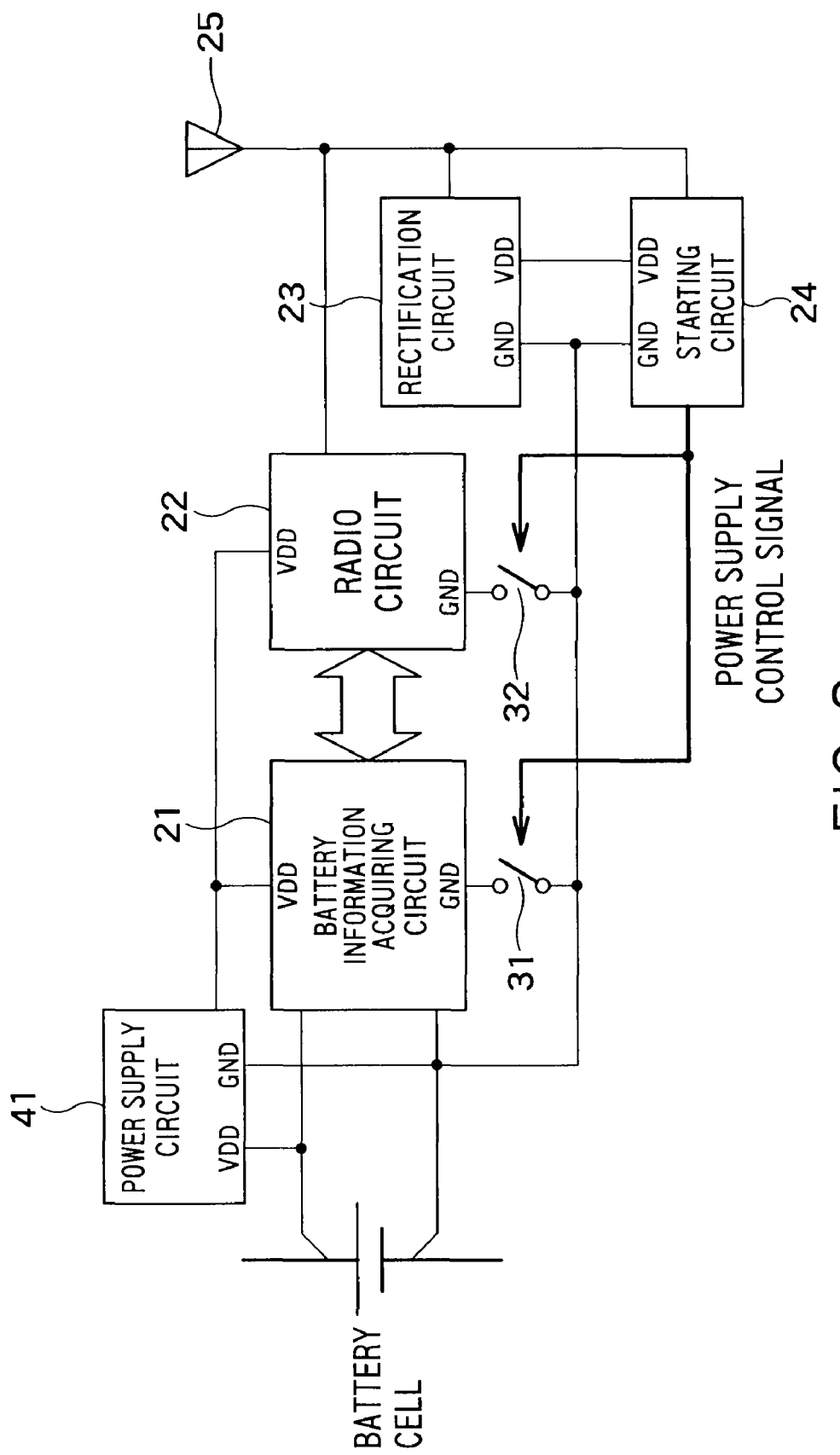
FIG. 3 shows a configuration with a power supply circuit that performs DC-DC conversion added to the module in FIG. 2.

In the configuration shown in FIG. 2, the battery information acquiring circuit 21 and the radio circuit 22 directly use the voltage of the battery cell as the power supply voltage, but the voltage of the battery cell may also be DC-DC converted and the DC-DC converted voltage (voltage higher or lower than the voltage of the battery cell) may also be used as the power supply voltage. For this purpose, a power supply circuit 41 for DC-DC converting the voltage of the battery cell may be provided as shown in FIG. 3, the voltage of the battery cell may be DC-DC converted by the power supply circuit 41 and the converted voltage may be given to the battery information acquiring circuit 21 and the radio circuit 22. Alternatively, both the voltage of the battery cell and the DC-DC converted voltage may be used and one may be given to the battery information acquiring circuit 21 and the other to the radio circuit 22.

Figure 4:
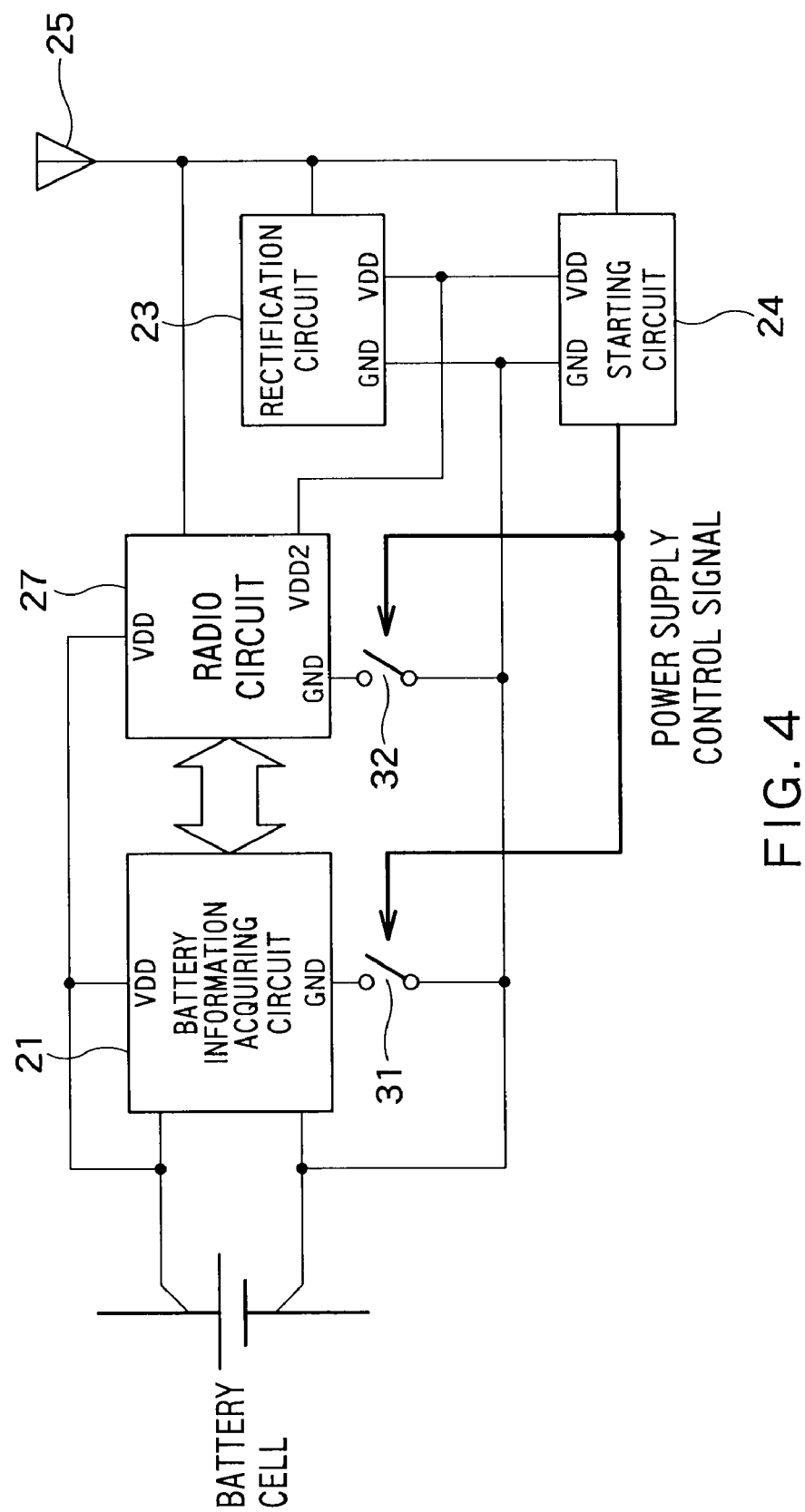
FIG. 4 shows a configuration that allows a DC voltage to be supplied to the radio circuit from the rectification circuit in the module in FIG. 2.
Figure 9:
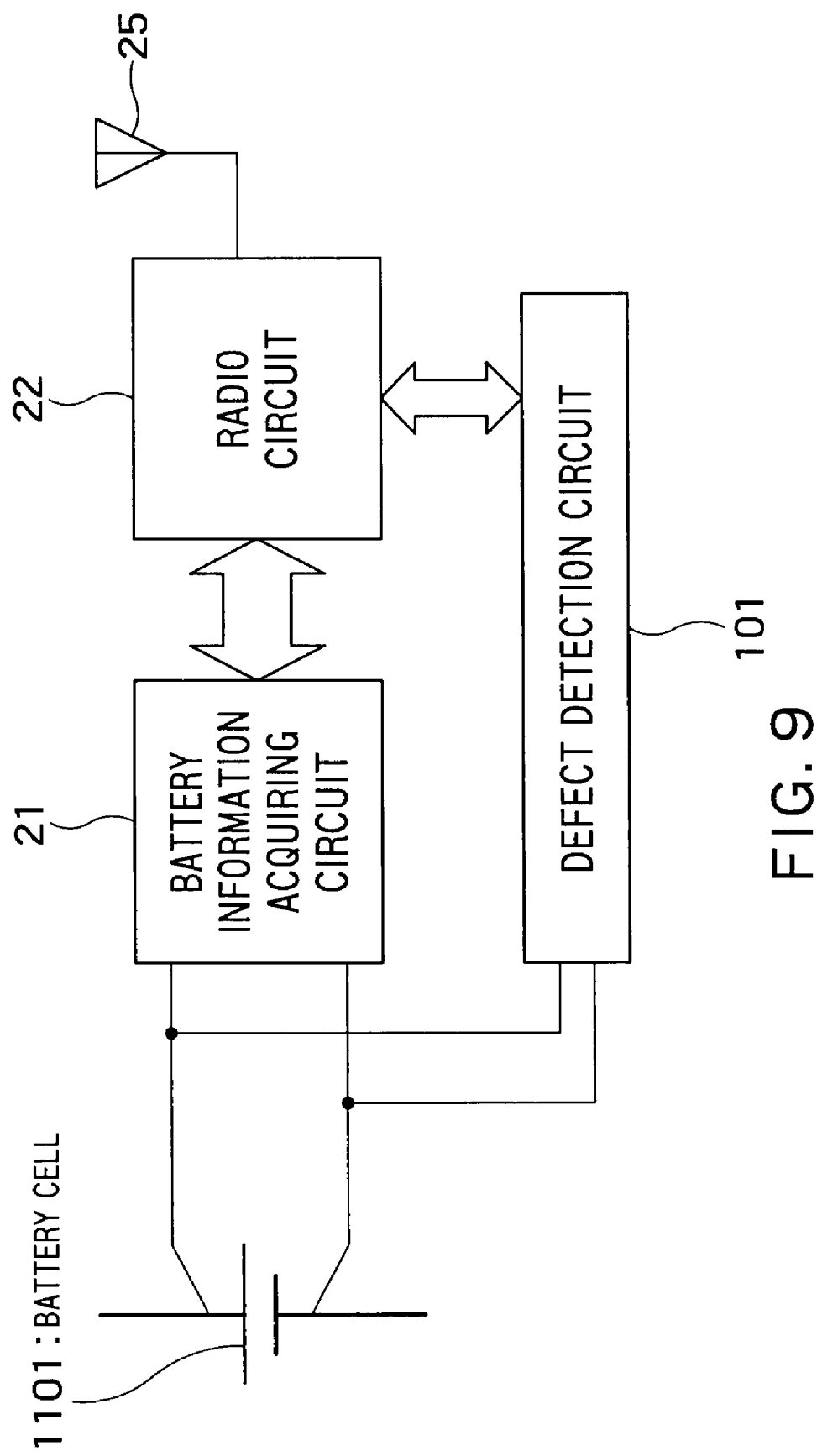
FIG. 9 shows a configuration example with a defect detection circuit for detecting defects of the module or battery cell added to the battery information acquiring module in FIG. 5.

Here, it is also possible to add a defect detection circuit 101 that detects the occurrence of a defect in the battery cell or the like and reports a defect signal to the management unit 12 as shown in FIG. 9 (illustrations of other elements such as the rectification circuit are omitted for simplicity of the drawing). However, when a defect occurs in the battery cell or the like, no voltage is supplied to the radio circuit 22 and the radio circuit 22 cannot transmit any defect signal. Therefore, as shown in FIG. 4, it is possible to adopt such a configuration that allows the rectification circuit 23 to supply a DC voltage to a radio circuit 27 so that the radio circuit 27 also operates on the DC voltage rectified by the rectification circuit 23. That is, a VDD terminal 2 is added to the radio circuit 27 and the added VDD terminal 2 is connected to the VDD terminal of the rectification circuit. When the switch unit 32 is turned ON while the rectification circuit 23 is operating, a power supply voltage (a fourth power supply voltage) is supplied from the rectification circuit 23 to the radio circuit 27 and the radio circuit 27 can operate even when no power supply voltage is supplied from the power supply cell. The radio circuit 27 includes a second voltage acquiring unit that acquires a power supply voltage from the rectification circuit as a fourth power supply voltage. Upon detecting a defect of the battery cell or the like, the defect detection circuit 101 in FIG. 9 sends a defect signal to the radio circuit 27 and the radio circuit 27 transmits the defect signal to the management unit 12 via the antenna. The details of the defect detection circuit 101 will be explained using FIG. 9 later. The management unit 12 may analyze contents of the received defect signal and output the analysis result to outside.

Figure 6:
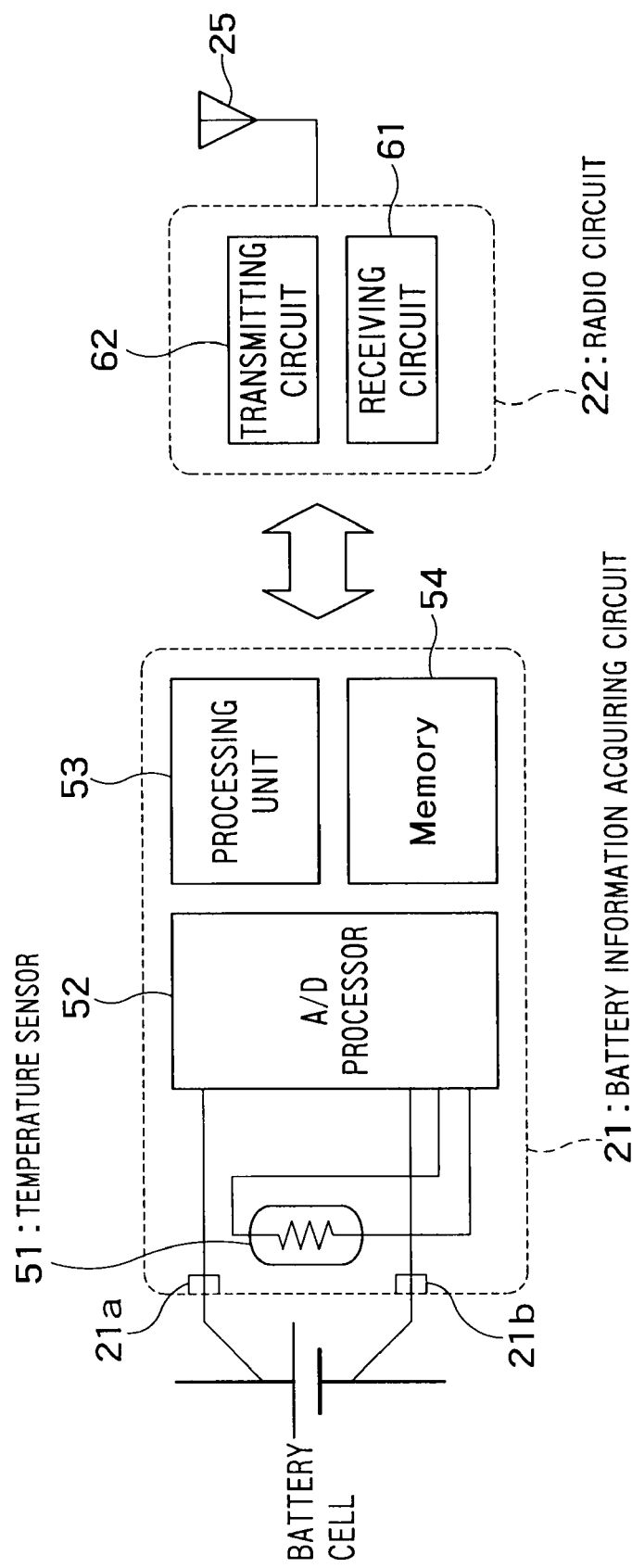
FIG. 6 shows a detailed configuration example of the battery information acquiring circuit and the radio circuit in the module in FIG. 2.

FIG. 6 shows an example of detailed configuration of the battery information acquiring circuit 21 and the radio circuit 22.

As described above, the battery information acquiring circuit 21 is connected to both ends of the battery cell via the input terminals 21a and 21b and acquires the voltage of the battery cell. Furthermore, the battery information acquiring circuit 21 is provided with a temperature sensor 51 such as thermistor and detects the temperature of the battery cell through the temperature sensor 51.

An A/D processor 52 converts an input voltage to the input terminals 21a and 21b to a digital signal.

A processing unit 53 controls the entire battery information acquiring circuit 21. The processing unit 53 transmits/receives data to/from the radio circuit 22 and performs control, upon receiving a transmission command instruction from the management unit 12 via the radio circuit 22, so as to acquire battery information of the battery cell and send the battery information to the radio circuit 22. In this control, the A/D processor 52 first receives the inter-terminal voltage of the battery cell and the detected voltage of the temperature sensor respectively and converts these voltages to digital signals respectively. Next, the processing unit 53 performs digital processing on these digital signals through digital processing logic, converts the digital signals to a data format appropriate for the management unit 12 and saves the data in this data format in a memory 54. Next, the processing unit 53 reads this data from the memory 54 and sends the data to the radio circuit 22. The digital signal may be stored in the memory 54 and sent to the radio circuit 22 without being converted to the above-described data format.

The radio circuit 22 is provided with a receiving circuit 61 that receives a high-frequency signal by radio from the management unit 12 via the antenna 25 and demodulates the received signal and a transmitting circuit 62 that modulates data to a high-frequency signal and transmits the modulated signal to the management unit 12 via the antenna 25.

The receiving circuit 61 checks whether or not the demodulated signal includes a transmission command signal of the battery information, converts, when the transmission command signal is included, the transmission command signal to an instruction (transmission command instruction) comprehensible to the processing unit 53 of the battery information acquiring circuit 21 and sends the instruction to the processing unit 53. Upon receiving the data (battery information) corresponding to the transmission command instruction from the processing unit 53, the transmitting circuit 62 modulates this data and transmits the data to the management unit 12 via the antenna 25.

As shown in FIG. 5, an example has been explained so far where one battery information acquiring module is connected for each battery cell. That is, a battery information acquiring module is connected to each of the plurality of battery cells connected in multi-series (e.g., N battery cells), one battery information acquiring module acquires battery information of one battery cell and transmits the battery information to the management unit 12. On the contrary, it is also possible to adopt a configuration in which one battery information acquiring module is connected to a plurality of battery cells, the one battery information acquiring module acquires battery information of these battery cells and transmits the battery information to the management unit 12.

Figure 7:
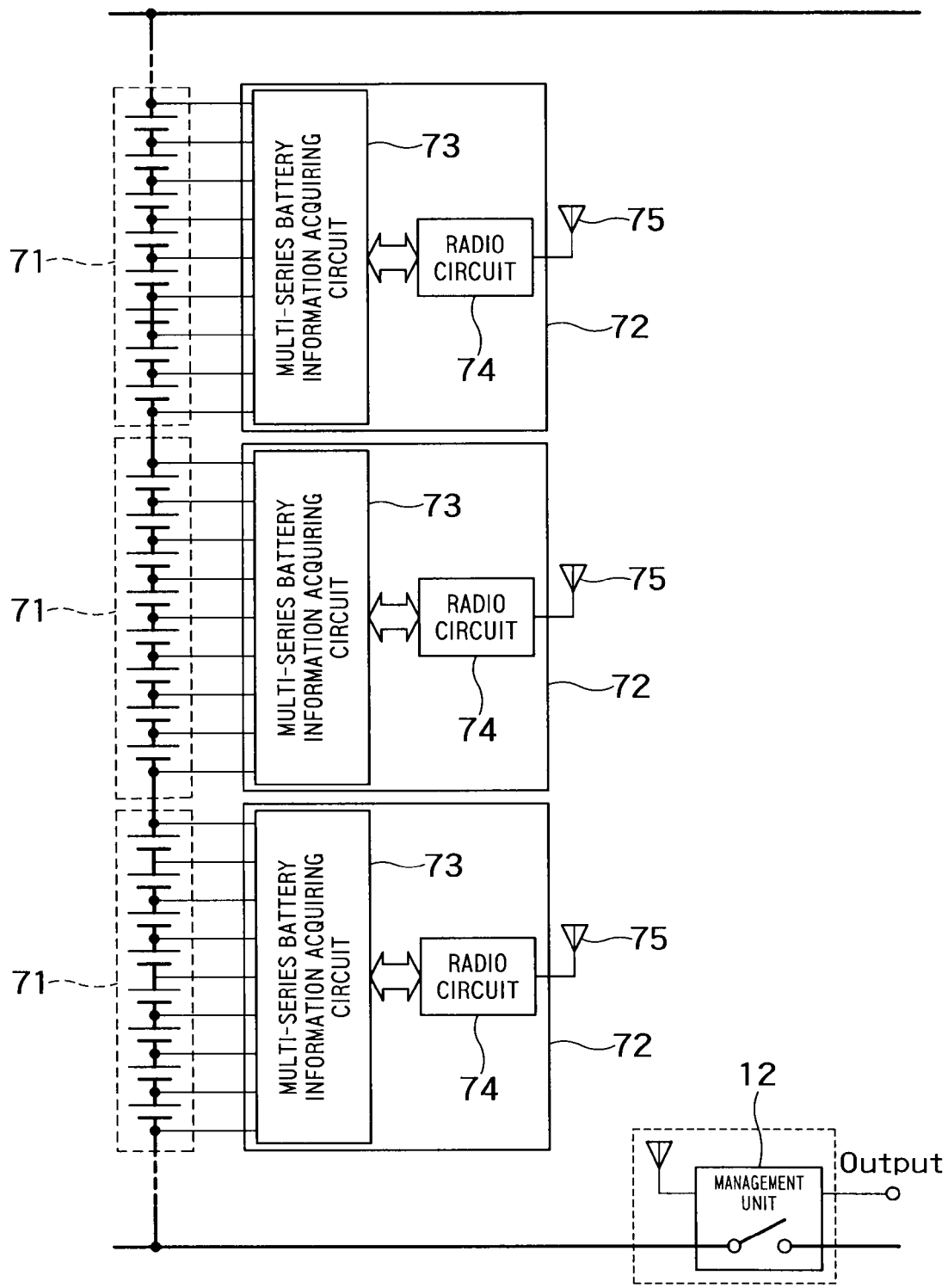
FIG. 7 shows a configuration example with one battery information acquiring module connected to a plurality of battery cells.

FIG. 7 shows a configuration example where one battery information acquiring module is connected to a plurality of battery cells.

The plurality (N) of serially connected battery cells are divided into a plurality of groups 71 each made up of M (M<N) battery cells and one battery information acquiring module 72 is connected for each of groups 71. The number of battery cells in each group may be the same or different. The battery information acquiring module 72 acquires battery information from each battery cell included in the corresponding group 71 and transmits the battery information to the management unit 12.

The battery information acquiring module 72 is provided with a multi-series battery information acquiring circuit 73, a radio circuit 74, an antenna 75, a rectification circuit, a starting circuit, a switch unit or the like. However, the rectification circuit, starting circuit and switch unit are omitted for simplicity of notation. The radio circuit 74, antenna 75, rectification circuit, starting circuit and switch unit have similar functions as those of elements of same names in FIG. 2 and the multi-series battery information acquiring circuit 73 has functions equivalent to those of the battery information acquiring circuit 21 in FIG. 2 except in that battery information is acquired from the plurality of battery cells.

When a comparison is made between the configuration of FIG. 7 and the configuration of FIG. 5, a voltage corresponding to one battery cell is applied to the battery information acquiring circuit 21 in the configuration of FIG. 5, and therefore there is an advantage that high-voltage parts or circuits are not necessary. On the other hand, in the configuration of FIG. 7, a voltage applied to the battery information acquiring circuit 73 corresponds to M battery cells, and therefore although the voltage applied to the battery information acquiring circuit 73 increases, there is an advantage that the number of parts such as the battery information acquiring circuit, radio circuit and antenna can be reduced. Therefore, a more appropriate configuration may be adopted depending on the operating conditions and operating situations of the battery information acquiring module as appropriate.

Figure 8:
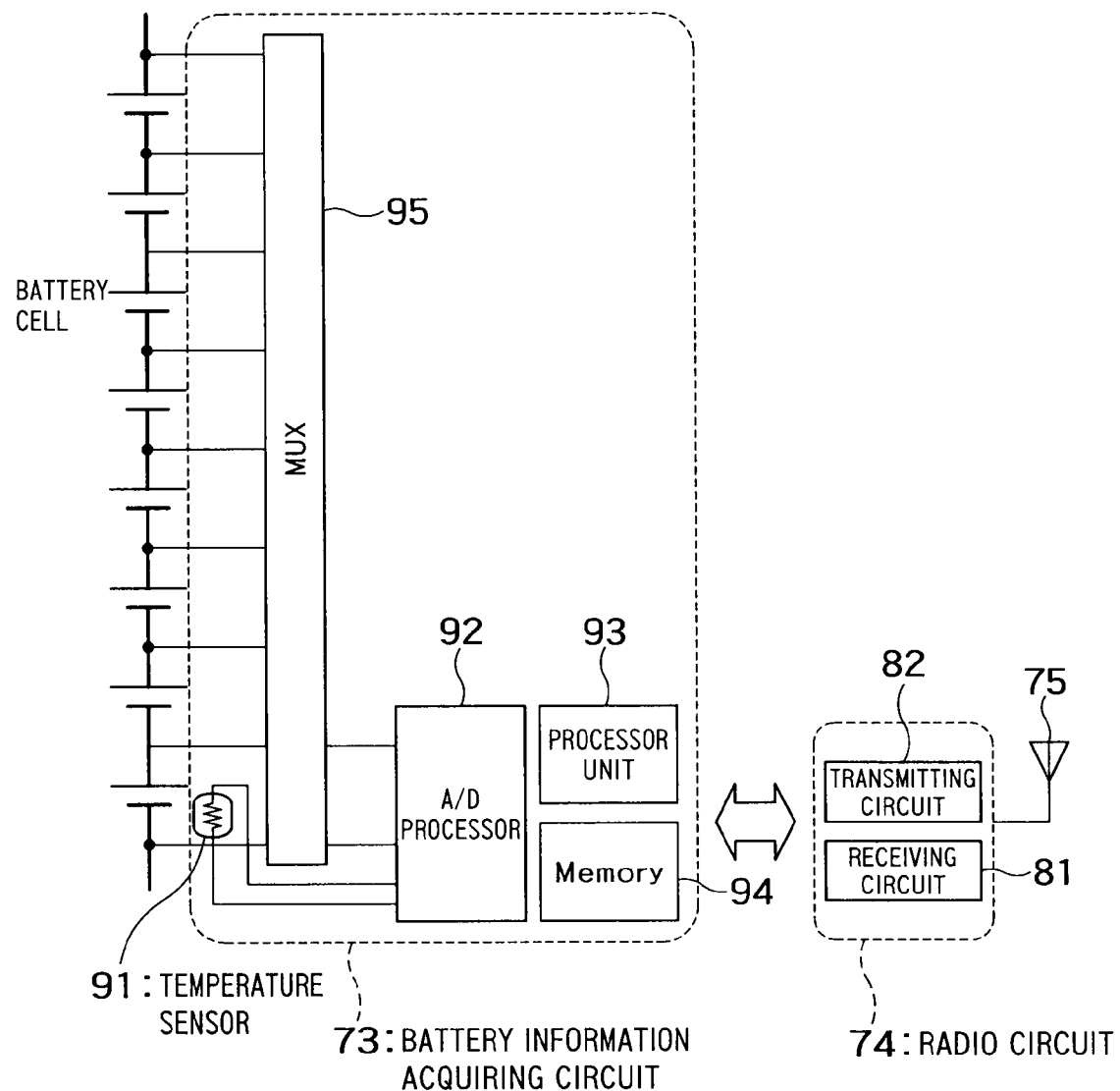
FIG. 8 shows a detailed configuration example of the multi-series battery information acquiring circuit and radio circuit in the module in FIG. 7.

FIG. 8 shows a detailed configuration example of the multi-series battery information acquiring circuit 73 and the radio circuit 74 in FIG. 7.

The multi-series battery information acquiring circuit 73 is provided with a temperature sensor 91, an A/D processor 92, a processing unit 93, a memory 94 and a selector (multiplexer) 95, and the radio circuit 74 is provided with a receiving circuit 81 and a transmitting circuit 82. Since the elements having the same names as those in FIG. 6 have basically equivalent functions, only the operation of the selector 95 which is not provided in FIG. 6 and extended operations of the elements having the same names as those in FIG. 6 will be explained below. The multi-series battery information acquiring circuit 73 and the radio circuit 74 are given a voltage between both ends of the M battery cells (in the example of FIG. 8, the voltage between the plus terminal of the battery cell at the upper end and the minus terminal of the battery cell at the lower end out of the M battery cells) as the power supply voltage.

The selector 95 is connected to the M battery cells and detects the inter-terminal voltage of each battery cell. The processing unit 93 controls the selector 95 so as to select a battery cell corresponding to a transmission command instruction from the management unit 12. The selector 95 selects one of the M battery cells according to an instruction from the processing unit 93 and outputs the voltage of the selected battery cell. The voltage of the selected battery cell is inputted to the A/D processor 92 and converted to a digital signal. The processing unit 93 receives and processes this digital signal. Here, the transmission command from the management unit 12 may include, for example, an instruction for selecting M battery cells one by one or an instruction for selecting only specific battery cells out of the M battery cells one by one.

Furthermore, the temperature sensor 91 is provided in correspondence with any one of the M battery cells. The detected temperature can be said to be a representative temperature of the M battery cells. The processing unit 93 acquires the voltage correspond to the temperature detected by the temperature sensor 91 according to a transmission command instruction from the management unit 12 via the A/D processor 92 as a digital signal and processes the acquired digital signal. Here, only one temperature sensor is arranged, but such a configuration may also be adopted that two or more temperature sensors and a second selector are arranged, the second selector selects a temperature sensor from among the temperature sensors and input the output voltage of the selected temperature sensor to the A/D processor 92.

Figure 10:
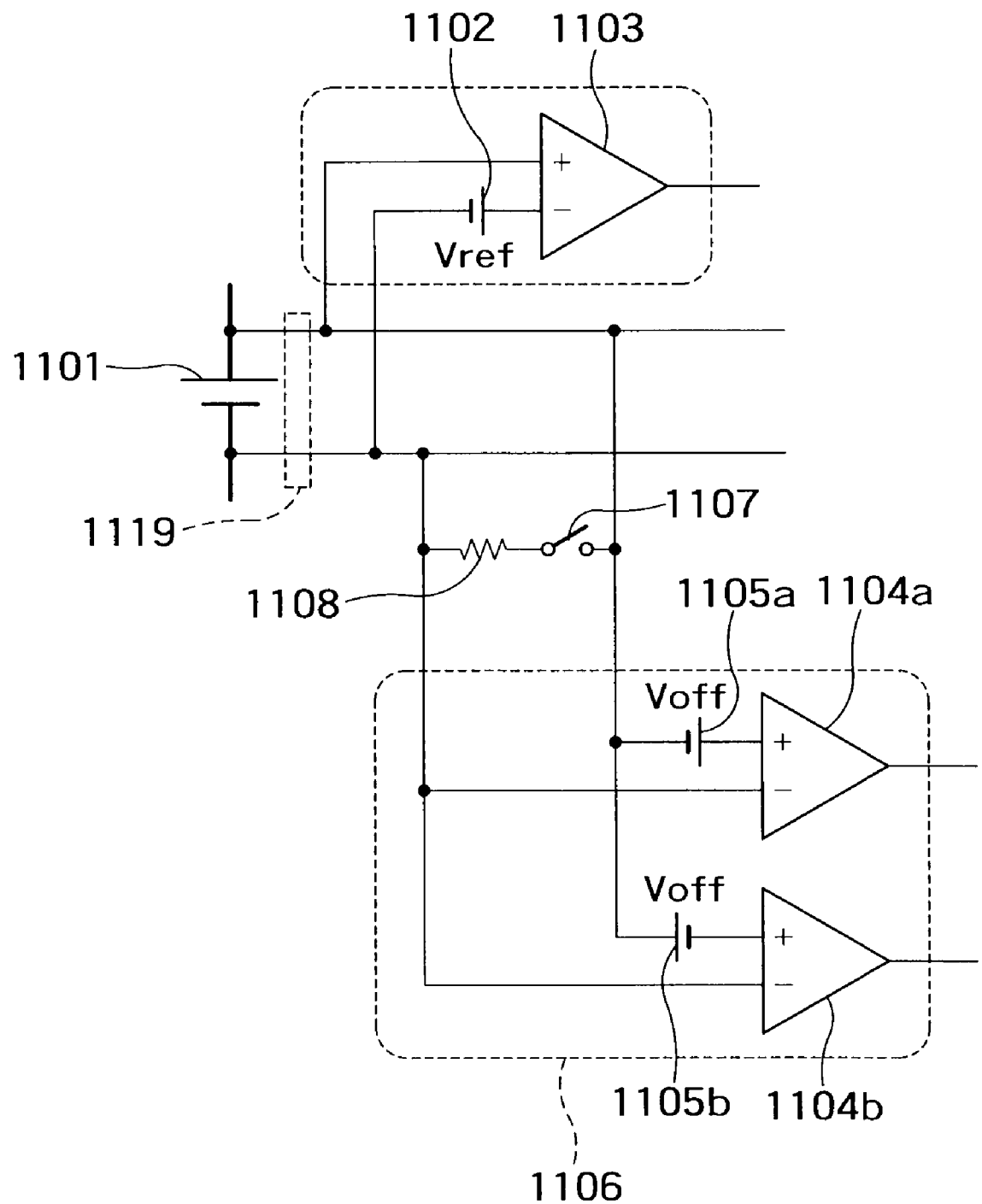
FIG. 10 shows a detailed configuration example of the defect detection circuit.

FIG. 9 shows a configuration example where a defect detection circuit (voltage comparison circuit, wire breakage detection circuit, short-circuit detection circuit) 101 for detecting a defect in the battery information acquiring module or a defect in the battery cell is added to the module in FIG. 5. FIG. 10 shows a detailed configuration example of the defect detection circuit 101. Here, an example is shown where the defect detection circuit 101 is arranged for the battery information acquiring module in FIG. 5, but the defect detection circuit 101 can also be likewise added to the battery information acquiring module in FIG. 7. In this case, defect detection circuits may be arranged for the M battery cells respectively. Hereinafter, the details of the defect detection circuit 101 will be explained. The defect detection circuit 101 has three main functions.

(1) A first function of the defect detection circuit 101 is the function of comparing an inter-terminal voltage of a battery cell 1101 with a predetermined voltage and detecting that the inter-terminal voltage falls below the predetermined voltage. The battery information acquiring circuit 21 operates on the voltage of the battery cell 1101, but when the voltage of the battery cell 1101 falls below a minimum operating voltage of the battery information acquiring circuit 21, the battery information acquiring circuit 21 can no longer operate and cannot correctly detect the battery information of the battery cell. Therefore, the defect detection circuit 101 checks whether the voltage of the battery cell 1101 has fallen below the minimum operating voltage of the battery information acquiring circuit using a circuit having a minimum operating voltage lower than that of the battery information acquiring circuit 21 or using a circuit that operates using a voltage source other than the battery cell 1101 and transmits, when the voltage of the battery cell 1101 has fallen below the minimum operating voltage, a first defect signal indicating that the voltage of the battery cell 1101 has fallen below the minimum operating voltage of the battery information acquiring circuit to the management unit 12 via the radio circuit 22.

To compare the inter-terminal voltage of the battery cell 1101 with the predetermined voltage and detect that the inter-terminal voltage has fallen below the predetermined voltage, a voltage resulting from adding a predetermined voltage (Vref) 1102 to the minus terminal of the battery cell 1101 as shown in FIG. 10 may be compared with the voltage of the plus terminal of the battery cell 1101 by a comparator 1103. The comparator 1103 outputs a high level signal when the inter-terminal voltage is equal to or greater than the predetermined voltage and outputs a low level signal (first defect signal) when the inter-terminal voltage is less than the predetermined voltage. The output signal from the comparator 1103 is transmitted to the management unit 12 via the radio circuit 22. The comparator 1103 corresponds to, for example, a voltage comparison circuit of the present invention and the predetermined voltage 1102 corresponds to, for example, a threshold voltage.

(2) A second function of the defect detection circuit 101 is the function of detecting that both terminals of the battery cell 1101 are short-circuited. As described above, the battery information acquiring circuit 21 operates on the voltage of the battery cell 1101, and therefore when both terminals of the battery cell 1101 are short-circuited and the potential difference becomes 0, the battery information acquiring circuit 21 can no longer operate and cannot correctly detect battery information of the battery cell. Therefore, the defect detection circuit 101 detects whether or not both terminals of the battery cell 1101 (i.e. inter-terminal) have short-circuited and when a short-circuit is detected, the defect detection circuit 101 transmits a second defect signal indicating the occurrence of a short-circuit of the inter-terminal of the battery cell 1101 to the management unit 12 via the radio circuit 22.

To detect a short-circuit of the inter-terminal of the battery cell 1101, the voltages of both terminals of the battery cell 1101 may be compared by a comparator 1106 as shown in FIG. 10. To obtain stable operation, the present embodiment uses here an offset comparator as the comparator 1106, in which voltage sources (Voff) 1105a and 1106b having greater voltages than the offset voltages of comparators 1104a and 1104b are oppositely connected to the two comparators 1104a and 1104b respectively. The output signals of the comparators 1104a and 1104b are transmitted to the management unit 12 via the radio circuit 22. When no short-circuit has occurred, both the comparators 1104a and 1104b output high level signals (that is, a normal signal is outputted from the comparator 1106). When a short-circuit has occurred, a signal of other combinations (at least one output of the comparators 1104a and 1104b is a low level signal) is outputted as a second defect signal. The comparator 1106 corresponds to, for example, a short-circuit detection circuit of the present invention.

(3) A third function of the defect detection circuit 101 is the function of detecting that a connection wire 1109 connecting the battery cell 1101 and the battery information acquiring circuit 21 each other is broken. When breakage of wire occurs, the battery information acquiring circuit 21 will no longer operate and cannot correctly detect battery information of the battery cell 1101. Therefore, the defect detection circuit 101 detects whether or not breakage of wire has occurred and transmits, upon detecting breakage of wire, a third defect signal indicating the occurrence of breakage of wire to the management unit 12 via the radio circuit 22.

To detect that the connection wire connecting the battery cell 1101 and the battery information acquiring circuit 21 is broken, a switch 1107 and a resistor 1108 may be connected in series between the input terminals of the aforementioned comparator (offset comparator) 1106, ON/OFF of the switch 1107 may be periodically toggled and the output of the comparator 1106 when the switch is ON (that is, outputs of the comparators 1104a and 1104b) may be checked. When there is no breakage in the connection wire with the battery cell 1101, if the switch 1107 is turned ON, a certain voltage is generated in the resistor 1108 and high level signals are outputted from both the comparators 1104a and 1104b as in the case where no short-circuit has occurred (that is, a normal signal is outputted from the comparator 1106). On the other hand, if the connection wire with the battery cell 1101 is broken, the voltage generated at the resistor 1107 becomes 0, and as a result, a low level signal is outputted from at least one of the comparators 1104a and 1104b as in the case where the short-circuit has occurred. The combination of the output signals of the comparators 1104a and 1104b (output signal of the comparator 1106) in this case corresponds to a third defect signal. The combination of the resistor 1108, switch 1107 and comparator 1106 corresponds to a wire breakage detection circuit of the present invention.

When the switch 1107 is fixed to OFF, if breakage of wire occurs, a certain voltage occurs between the respective input terminals of the comparator 1106 due to the parasitic capacitance between the wires connected to both ends of the battery cell 1101, and therefore a normal signal is outputted from the comparator 1106 and it is not possible to detect the breakage of wire. However, when the switch 1107 is turned ON once after the breakage of wire, the charge of the parasitic capacitance is discharged, the voltage occurring at the resistor 1107 becomes 0 (that is, voltage between the wires becomes 0), and it is therefore possible to detect the breakage of wire.

Figure 11:
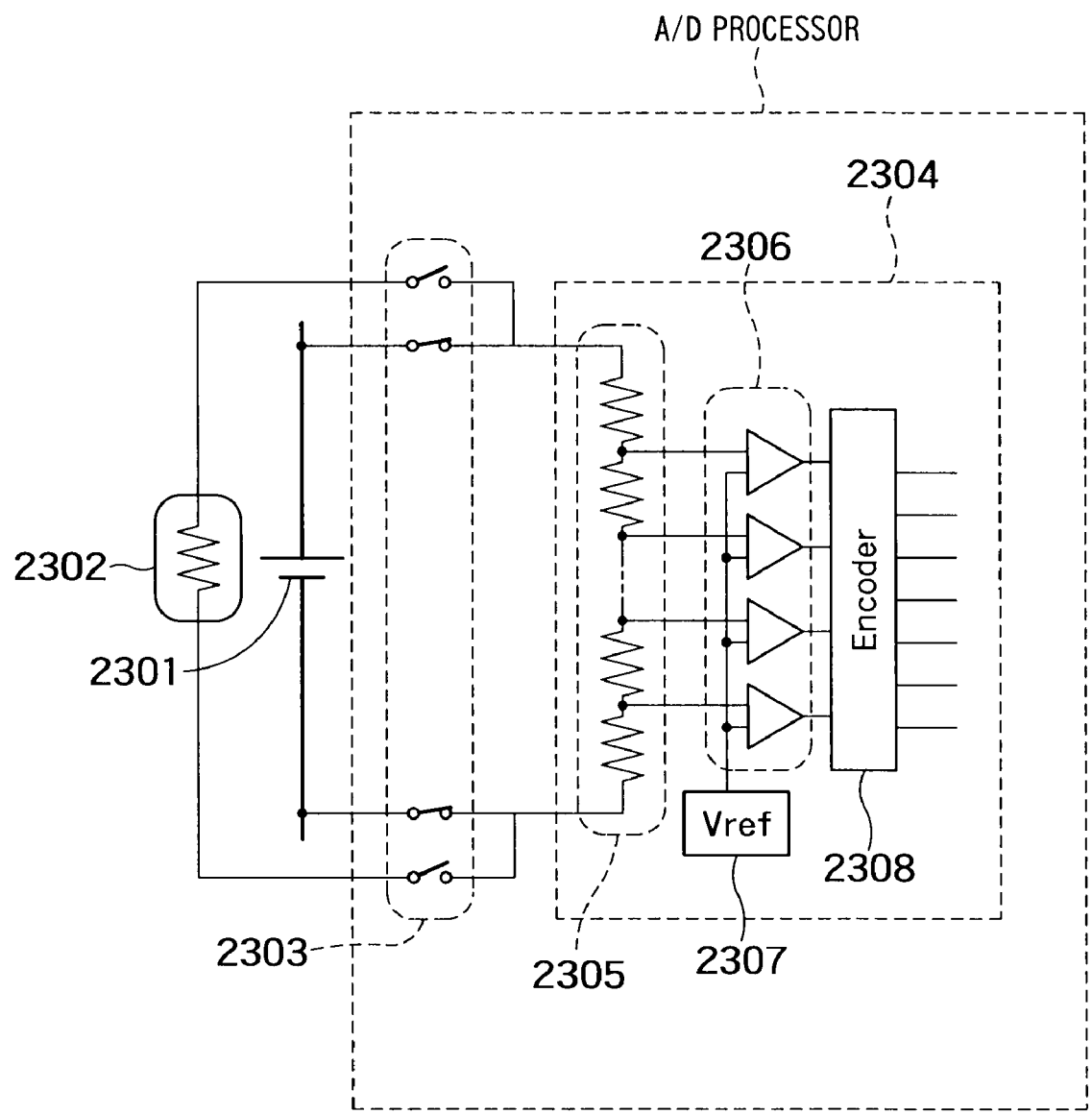
FIG. 11 shows a detailed configuration example of an A/D processor.
Figure 12:
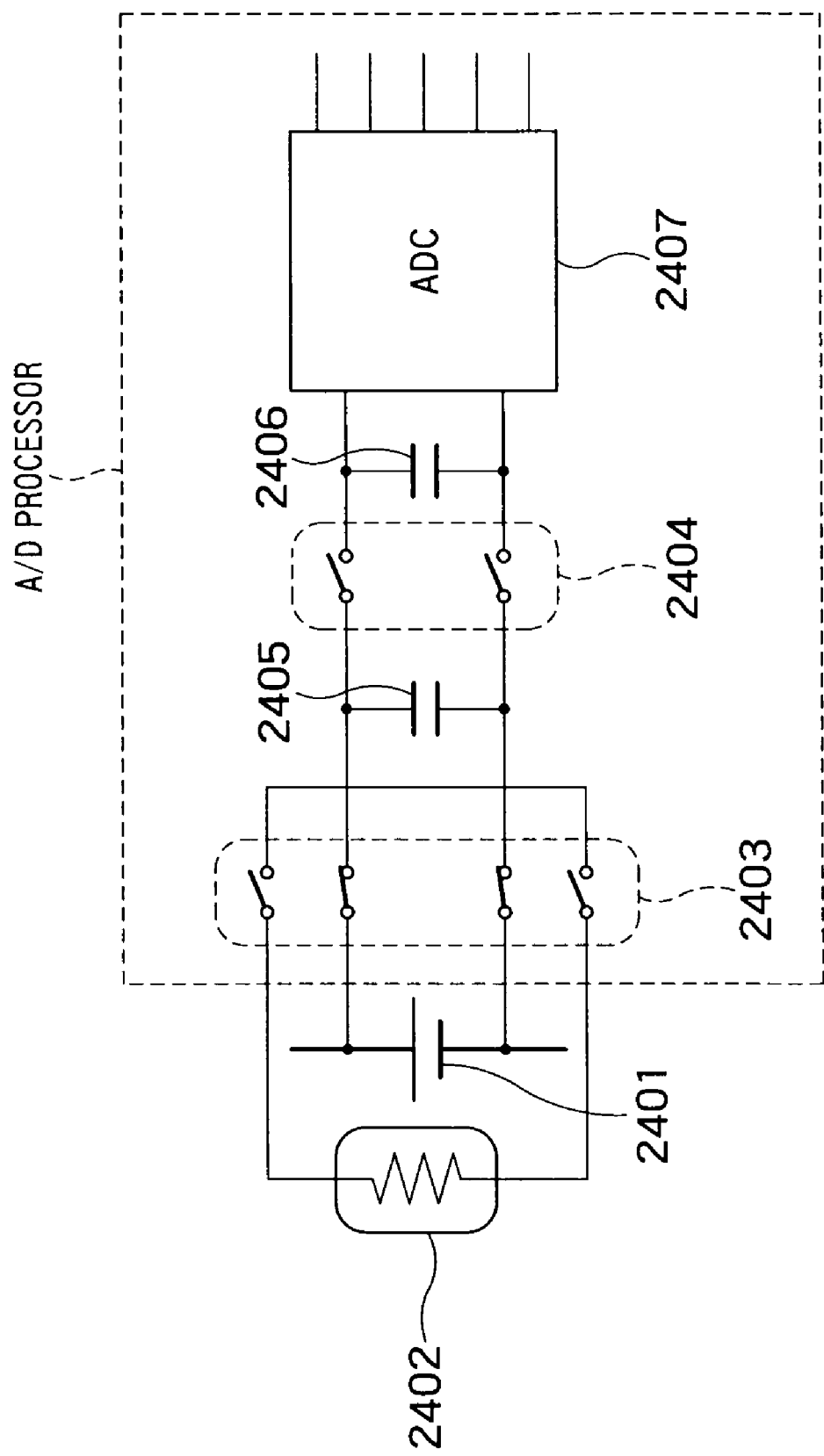
FIG. 12 shows another detailed configuration example of the A/D processor.

FIG. 11 and FIG. 12 show detailed configuration examples of the A/D processor shown in FIG. 6 and FIG. 8.

Since the voltage of the battery cell is used as the power supply voltage of the A/D processor, the A/D processor needs to A/D-convert a voltage equal to the power supply voltage of the A/D processor itself. However, when the DC-DC converted voltage (lower than the voltage of the battery cell) is used as the power supply voltage of the A/D processor as shown in FIG. 3, a voltage greater than the DC-DC converted voltage needs to be A/D-converted. FIG. 11 shows a configuration example where the input voltage range and resolution are made variable and a voltage greater than the power supply voltage of the A/D processor itself is directly A/D-converted. FIG. 12 shows a configuration example where the input voltage is divided and the divided voltage is A/D-converted by a A/D converter (ADC) having a fixed input voltage range.

In FIG. 11, a battery cell 2301 and a temperature sensor 2302 are connected in parallel and one of the inter-terminal voltage of the battery cell 2301 and the detected voltage of the temperature sensor 2302 is selectively inputted to the A/D converter 2304 by switching the switch 2303. The inputted voltage is divided into $2^N$ voltages by serially connected $2^N+1$ resistors (resistor units) 2305 and inputted to $2^N$ comparators (comparison units) 2306. Here, "N" denotes the number of bits of an A/D converter 2304. A reference voltage (Vref) 2307 is inputted to the other input of each comparator 2306.

Each comparator 2306 compares the inputted divided voltage with the reference voltage (Vref) 2307 and outputs a signal indicating the magnitude relationship between the two. When, for example, the inputted divided voltage is greater than the reference voltage (Vref) 2307, a high level signal is outputted and when the inputted divided voltage is less than the reference voltage (Vref) 2307, a low level signal is outputted.

The output signal of each comparator 2306 is inputted to an encoder (voltage data generator) 2308 and the encoder 2308 outputs digital code (voltage data) indicating how many times the reference voltage the voltage inputted to the A/D processor is. That is, if the voltage of the battery cell 2301 is assumed to be greater than the reference voltage 2307, the output contents of each comparator 206 are switched on the boundary of comparator 26 where the divided voltage becomes smaller than the reference voltage 2307, and it is thereby possible to detect how many times the reference voltage 2307 the voltage of the battery cell 2301 is depending on the boundary position. The range of the input voltage is variable from the reference voltage to $2^N$ times the reference voltage.

When the voltage of the battery cell 2301 is substantially different from the voltage of the temperature sensor 2302, it is also possible to provide two types of reference voltage and change the reference voltage to be used in conjunction with the switch 2303.

In FIG. 12, a battery cell 2401 and a temperature sensor 2402 are connected in parallel and one of the inter-terminal voltage of the battery cell 2401 and the detected voltage of the temperature sensor 2402 is selected by switching of switches 2403. To reduce the selected voltage, switches 2404 are turned OFF first and the voltage is then charged into a capacitor 2405. After a predetermined time period necessary for charging, the switches 2403 are turned OFF and the switches 2404 are turned ON. The charge charged in the capacitor 2405 is redistributed between the capacitor 2405 and the capacitor 2406. The capacitors 2405, 2406 and switch 2404 correspond to a voltage dividing unit of the present invention.

Assuming the ratio between the capacitor 2405 and capacitor 2406 is 1:(N−1), the voltage of the capacitor 2406 corresponds to 1/N of the inter-terminal voltage of the battery cell 2401 or 1/N the detected voltage of the temperature sensor 2402. This voltage is converted by an A/D converter 2407 to a digital signal. When the detected voltage of the temperature sensor 2402 is smaller than an upper limit of the range of the input voltage of the A/D converter 2407, it is possible to turn ON the switches 2403 and the switches 2404 and directly input the detected voltage of the temperature sensor 2402 to the A/D converter 2407 without reducing the voltage.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

What is claimed is:

1. A battery information acquiring apparatus that acquires battery information of a battery cell in a battery pack including a plurality of the battery cells connected in series or in parallel and transmits the battery information to a management unit that manages a state of the battery pack via an antenna, comprising:

a voltage acquiring unit configured to acquire an inter-terminal voltage of the battery cell;

a battery information acquiring circuit configured to acquire battery information of the battery cell, the battery information acquiring circuit being supplied with the inter-terminal voltage acquired by the voltage acquiring unit as a first power supply voltage;

a radio circuit configured to transmit a signal of the battery information to the management unit via the antenna, the radio circuit being supplied with the inter-terminal voltage acquired by the voltage acquiring unit as a second power supply voltage;

a rectification circuit configured to receive a radio signal from the management unit via the antenna and rectify the received radio signal to generate a DC voltage; and a control circuit configured to control supply of the first and second power supply voltages to the battery information acquiring circuit and the radio circuit, the control circuit being supplied with the DC voltage generated by the rectification circuit as a third power supply voltage, wherein the control circuit includes:

a first command receiver configured to receive a first command signal indicating whether or not to supply the first power supply voltage to the battery information acquiring circuit, from the management unit via the antenna;

a second command receiver configured to receive a second command signal indicating whether or not to supply the second power supply voltage to the radio circuit, from the management unit via the antenna;

a first controller configured to control supply of the first power supply voltage to the battery information acquiring circuit according to the first command signal; and a second controller configured to control supply of the second power supply voltage to the radio circuit according to the second command signal.

2. The apparatus according to claim 1, further comprising a power supply circuit configured to DC-DC convert the inter-terminal voltage of the battery cell, wherein the voltage resulting from DC-DC converting the inter-terminal voltage of the battery cell is supplied to the battery information acquiring circuit and the radio circuit as the first and second power supply voltages from the power supply circuit.

3. The apparatus according to claim 1, wherein the battery information acquiring unit acquires at least one of the inter-terminal voltage of the battery cell and a temperature of the battery cell as the battery information.

4. The apparatus according to claim 3, wherein the battery information acquiring unit comprises a voltage input unit configured to input the inter-terminal voltage of the battery cell, a temperature sensor configured to detect the temperature of the battery cell and an A/D processor, and the A/D processor acquires a first voltage which is the inter-terminal voltage of the battery cell via the input unit, acquires a second voltage representing the temperature of the battery cell via the temperature sensor, converts the first and second voltages to digital signals respectively and transmits the digital signals to the radio circuit.

5. The apparatus according to claim 1, wherein the battery information acquiring unit acquires respective inter-terminal voltages of M (M is an integer equal to 2 or greater) serially connected battery cells and a temperature of at least one of the M battery cells as the battery information, and a voltage between both ends of the M serially connected battery cells is supplied as the first power supply voltage and the second power supply voltage to the battery information acquiring unit and the radio circuit.

6. The apparatus according to claim 5, wherein the battery information acquiring unit comprises a plurality of voltage input units configured to input respective inter-terminal voltages of the M battery cells, a selector configured to select one of the voltage input units, a temperature sensor configured to detect a temperature of at least one of the battery cells and an A/D processor, and the A/D processor acquires a first voltage which is the inter-terminal voltage of the battery cell via the input unit selected by the selector, acquires a second voltage representing a temperature of the battery cell via the temperature sensor, converts the first and second voltages to digital signals respectively and transmits the digital signals to the radio circuit.

7. The apparatus according to claim 4, wherein the A/D processor comprises:

a plurality of serially connected resistor units configured to divide the first or second voltage;

a comparison unit configured to compare a voltage at one end of each of the resistor units with a reference voltage and generate a comparison signal representing a magnitude relationship between the reference voltage and the voltage at the one end of each of the resistor units, respectively; and a voltage data generator configured to generate voltage data representing the first or the second voltage based on each generated comparison signal and send out the voltage data generated to the radio circuit.

8. The apparatus according to claim 4, wherein the A/D processor comprises:

a voltage dividing unit configured to divide the first or second voltage by a plurality of capacitors connected in parallel; and an A/D converter configured to A/D-convert a voltage applied to one of the capacitors and send out the A/D-converted voltage to the radio circuit.

9. The apparatus according to claim 1, wherein the radio circuit has unique ID, and the radio circuit transmits a signal including both of the ID and the battery information to the management unit.

10. The apparatus according to claim 1, further comprising a voltage comparison circuit configured to compare the inter-terminal voltage of the battery cell with a threshold voltage, wherein when the inter-terminal voltage of the battery cell falls below the threshold voltage, the voltage comparison circuit sends a first defect signal to the radio circuit, and the radio circuit transmits the first defect signal to the management unit via the antenna.

11. The apparatus according to claim 1, further comprising a short-circuit detection circuit configured to detect a short-circuit of the inter-terminal of the battery cell, wherein the short-circuit detection circuit sends a second defect signal to the radio circuit upon detecting the short-circuit of the inter-terminal of the battery cell, and the radio circuit transmits the second defect signal to the management unit via the antenna.

12. The apparatus according to claim 1, further comprising a wire breakage detection circuit configured to detect breakage of connection wire between the battery cell and the battery information acquiring circuit, wherein the wire breakage detection circuit sends a third defect signal to the radio circuit upon detecting breakage of the connection wire, and the radio circuit transmits the third defect signal to the management unit via the antenna.

13. The apparatus according to claim 10, wherein the radio circuit comprises a second voltage acquiring unit configured to acquire the generated DC voltage from the rectification circuit as a fourth power supply voltage, and the radio circuit operates, when the supply of the second voltage from the voltage acquiring unit is stopped, using the fourth power supply voltage.

* * * * *